United States Patent

Nakanishi et al.

[11] Patent Number: 5,833,920
[45] Date of Patent: Nov. 10, 1998

[54] COPPER ALLOY FOR ELECTRONIC PARTS, LEAD-FRAME, SEMICONDUCTOR DEVICE AND CONNECTOR

[75] Inventors: Teruo Nakanishi; Akira Maeda; Mikio Watanabe, all of Tokyo; Toshikazu Kawahata, Joetsu; Toshihiro Kurita, Joetsu; Kenji Kubozono, Joetsu, all of Japan

[73] Assignees: Mitsubishi Denki Kabushiki Kaisha, Tokyo; Mitsubishi Electric Metecs Co., Ltd., Joetsu, both of Japan

[21] Appl. No.: 802,868

[22] Filed: Feb. 19, 1997

[30] Foreign Application Priority Data

Feb. 20, 1996 [JP] Japan .................... 8-032201

[51] Int. Cl.[6] ........................................ H01B 1/00
[52] U.S. Cl. ...................... 420/477; 420/473; 420/481
[58] Field of Search ................................... 420/469, 476, 420/477, 481, 473

[56] References Cited

FOREIGN PATENT DOCUMENTS

| | | |
|---|---|---|
| 62-185847 | 8/1987 | Japan . |
| 63-105943 | 5/1988 | Japan . |
| 63-130739 | 6/1988 | Japan . |
| 63-241131 | 10/1988 | Japan . |
| 63-317636 | 12/1988 | Japan . |
| 1-168830 | 7/1989 | Japan . |
| 2-270945 | 11/1990 | Japan . |
| 3-87326 | 4/1991 | Japan . |
| 4-99839 | 3/1992 | Japan . |
| 7-88549 | 9/1995 | Japan . |

*Primary Examiner*—Sikyin Ip
*Attorney, Agent, or Firm*—Oblon, Spivak, McClelland, Maier & Neustadt, P.C.

[57] ABSTRACT

The present invention provides a copper alloy for electronic part which is excellent in adhesion of silver(Ag) and reliability of solderability and adhesion of plating without impairing excellent strength and electrical conductivity of a copper-nickel-silicon alloy. The copper alloy for electronic parts in the present invention consist essentially of 1.7 to 4.0% by weight of nickel, 0.3 to 0.8% by weight of silicon, 0.002 to 0.3% by weight of silver, 0.5 to 2.0% by weight of zinc, and a residual of copper.

20 Claims, 4 Drawing Sheets

COPPER ALLOY FOR ELECTRONIC PARTS, LEAD-FRAME, SEMICONDUCTOR DEVICE AND CONNECTOR

BACKGROUND OF THE INVENTION

The present invention relates to a copper alloy for electronic parts and a lead-frame for integrated circuit (IC), semiconductor device and connector which are made of such a copper alloy. Particularly the present invention relates to the copper alloy for electronic parts which has a high strength and a good electrical conductivity and thermal conductivity and is excellent in adhesion of plating, solderability and long-term reliability thereof, and an IC lead-frame, semiconductor device and connector which are made of the copper alloy.

With the advance of downsizing, multiplex functionalization and surface mounting in electronic apparatuses, rapid progress has been made with respect to thickness-thinning, use of multiple pins and narrowing of pitches in electronic parts such as IC lead-frames and connectors. In compliance with the above tendency, reliability of connection in actual mounting has been strongly demanded.

Namely with the advancement of downsizing of electronic parts, since the electronic parts are made thinner or are formed to a narrow lead part, not only more improvement of strength of the electronic parts is required but also materials for electronic parts which have excellent electrical conductivity are demanded because sectional area becomes smaller.

Also with the advancement of high integration in an integrated circuit, etc., the improvement of heat radiation are desired and for that reason, lead-frame materials which are excellent in thermal conductivity and electrical conductivity which is proportional to the thermal conductivity are demanded.

Meanwhile a copper-nickel-silicon alloy is proposed in JP-A-86838/1988, JP-A-105943/1988, JP-B-56294/1991, etc., and it is known that by combining rolling step and heat treatment step, intermetallic compounds such as $Ni_5Si_2$ and $Ni_2Si$ are formed, and consequently such a copper-nickel-silicon alloy is useful as copper alloys for electronic parts having excellent strength and electrical conductivity.

However, electronic parts such as IC lead-frames and connectors are used after plating with silver(Ag), tin(Sn) and tin-lead(Sn—Pb) for electrical connection, and therefore, are required to have not only excellent strength and electrical conductivity but also adhesion to silver and reliability of plating.

For example, in semiconductor devices, a wire (gold wire) is bonded to a silver plating part on a surface of a lead to electrically connect a bonding pad on a semiconductor chip to the lead part.

Heating is carried out, when die-bonding the semiconductor chip to a die pad and also when wire-bonding.

Therefore, reliability is required with respect to adhesion of silver plating to a material making the lead part of the semiconductor device.

The semiconductor devices are finished into semiconductor products after subjected to heat history such as burn-in step for screening of the product after a surface of the lead part outside a resin mold is tin-lead-plated.

Therefore, the tin-lead plating on the lead part is required not to be peeled off even after the heat history such as the burn-in step, and in addition, good solderability is demanded when the lead part is soldered.

The present invention has been completed in view of the above-mentioned points. An object of the present invention is to provide a copper alloy for electronic parts which has, besides excellent strength and electrical conductivity of a copper-nickel-silicon alloy, good adhesion to silver(Ag) and excellent reliability with respect to solderability and adhesion of plating even after the long lapse of time or heat history after tin-lead plating or tin plating.

The second object of the present invention is to improve life of a graphite die in horizontal continuous casting and life of the die in stamping.

The third object of the present invention is to provide an IC lead-frame which is excellent in strength, electrical conductivity and adhesion to silver plating and has good reliability with respect to solderability and adhesion to plating.

The fourth object of the present invention is to provide a semiconductor device which has a lead part excellent in strength and electrical conductivity, has a lead part of which connection with wire is maintained strongly for a long period of time, and is excellent in soldering of a wire to the lead part.

The fifth object of the present invention is to provide a connector excellent in strength, electrical conductivity and adhesion of silver plating and having good reliability with respect to solderability and adhesion of solder plating.

SUMMARY OF THE INVENTION

According to the first invention, there can be provided a copper alloy for electronic parts consisting essentially of copper as a major component, 1.7 to 4.0% by weight of nickel, 0.3 to 0.8% by weight of silicon, 0.002 to 0.3% by weight of silver and 0.5 to 2.0% by weight of zinc.

According to the second invention, there can be provided a copper alloy for electronic parts consisting essentially of copper as a major component, 1.7 to 4.0% by weight of nickel, 0.3 to 0.8% by weight of silicon, 0.05 to 0.3% by weight of silver and 0.5 to 2.0% by weight of zinc.

According to the third invention, there can be provided a copper alloy for electronic parts, which has, in any one of the first and second inventions, when the silver content is assumed to be Y % by weight and the zinc content is assumed to be X % by weight, the relation between X and Y represented by the following equation (1):

$$\log Y \geq 2.2X - 5 \qquad (1)$$

According to the fourth invention, there can be provided a copper alloy for electronic parts which contains 0.0005 to 0.01% by weight of boron in addition to the components of any one of the first to the third inventions.

According to the fifth invention, there can be provided a copper alloy for electronic parts which go contains 0.1 to 0.4% by weight of tin in addition to the components of any one of the first to the fourth inventions.

According to the sixth invention, there can be provided a copper alloy for electronic parts which contains 0.001 to 0.01% by weight of lead in addition to the components of any one of the first to the fifth inventions.

According to the seventh invention, an IC lead-frame is made of the copper alloy for electronic parts of any one of the first to the sixth inventions.

According to the eighth invention, a semiconductor device comprises a die pad and lead parts. On the die pad is provided a semiconductor chip having a plurality of bonding pads on the surface thereof. The die pad is made of the copper alloy for electronic parts of any one of the first to the sixth inventions and is adhered to the back surface of the semiconductor chip. The lead parts are made of the copper alloy for electronic parts of any one of the first to the sixth inventions, and are provided for the respective corresponding bonding pads of the semiconductor chip and connected to the corresponding bonding pads electrically by wires.

According to the ninth invention, a connector is made of the copper alloy for electronic parts of any one of the first to the sixth inventions.

DESCRIPTION OF THE PREFERRED EMBODIMENTS

EMBODIMENT 1

Figure 1:
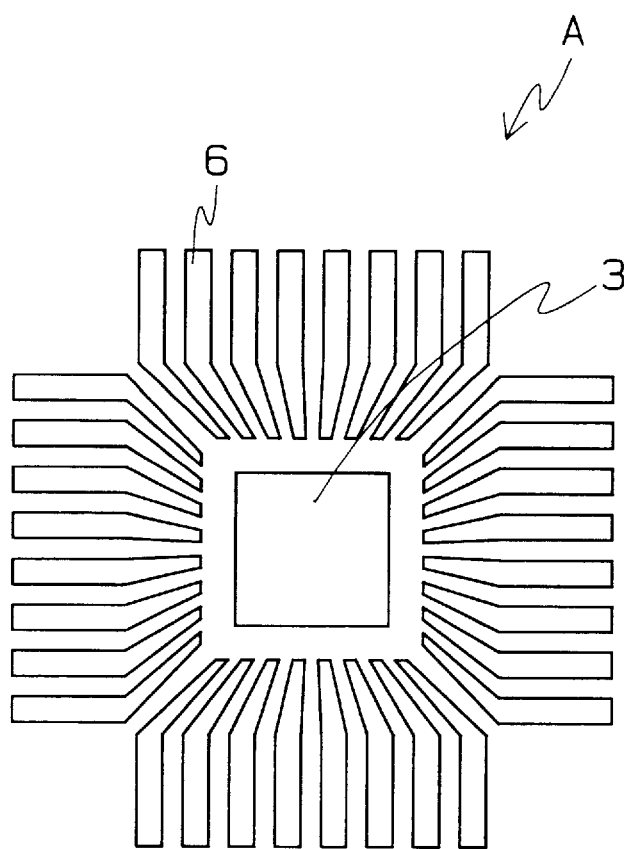
FIG. 1 is a plan view of the IC lead-frame of EMBODIMENT 7 of the present invention.

EMBODIMENT 1 of the present invention relates to the copper alloy for electronic parts which consists essentially of copper as a major component, 1.7 to 4.0% by weight of nickel(Ni), 0.3 to 0.8% by weight of silicon(Si), 0.002 to 0.3% by weight of silver(Ag) and 0.5 to 2.0% by weight of zinc(Zn).

The electronic parts in the present invention include, for example, an IC lead-frame, connector, spring for electrical apparatuses, spring for relay, commutator, slide contact for volume, spring terminal for switch and the like.

Also in the present invention, copper as a major component means not only pure copper but also copper containing unavoidable impurities in a minimum amount. In other words, the copper alloy for electronic parts of the present invention is an alloy comprising copper containing unavoidable impurities in a minimum amount and the specific elements in the specific amounts. This applies to all the EMBODIMENTS mentioned hereinafter.

In the above-mentioned EMBODIMENT 1, nickel and silicon are added to precipitate nickel-silicon compounds such as $Ni_5Si_2$ and $Ni_2Si$ in copper which is a major component and improve strength and electrical conductivity.

It is preferable that a nickel content is from 1.7 to 4.0% by weight, particularly from 2 to 3% by weight and a silicon content is from 0.3 to 0.8% by weight, particularly from 0.4 to 0.7% by weight, from the viewpoint of precipitating nickel-silicon compounds for improving strength and electrical conductivity.

Namely, if the nickel or silicon content is less than the lower limit of the above-mentioned ranges, improvement of strength is poor and the desired strength cannot be obtained. And even if more than the upper limit, strength cannot be improved more and electrical conductivity is lowered.

Silver is added to the copper alloy for electronic parts of the present invention to improve adhesion of silver plating to the copper alloy when silver(Ag) plating is applied to the copper alloy, and also to inhibit lowering of solderability after heat history of tin(Sn) plating or solder plating (hereinafter referred to as "tin-lead(Sn—Pb) plating) when such a plating is applied to the copper alloy for electronic parts of the present invention.

It is preferable that a silver content is from 0.002 to 0.3% by weight, more preferably from 0.05 to 0.3% by weight, from the viewpoint of inhibiting lowering of solderability.

Namely, when the silver content is not less than 0.002% by weight, effect of inhibition of lowering solderability is good when a heat resisting test is carried out after plating to the copper alloy for electronic parts of the present invention. When not less than 0.05% by weight, particularly remarkable effect of inhibition of lowering solderability is exhibited.

On the contrary, if the silver content is more than 0.3% by weight, more effect of inhibition of lowering solderability cannot be obtained and cost becomes high.

Zinc is added to the copper alloy for electronic parts of the present invention to improve adhesion of tin plating or tin-lead plating to the copper alloy when tin plating or tin-lead plating is applied to the copper alloy, namely, to inhibit peeling of tin plating or tin-lead plating after heat history.

It is preferable that a zinc content is from 0.5 to 2.0% by weight, particularly from 0.6 to 1.2% by weight, from the viewpoint of inhibiting peeling of plating.

Namely, when the zinc content is not less than 0.5% by weight, a remarkable effect of inhibition of peeling of plating is exhibited when a heat resisting test is carried out after plating to the copper alloy for electronic parts of the present invention.

To the contrary, if the zinc content is more than 2.0% by weight, more effect of inhibition of peeling of plating cannot be obtained and solderability after the heat resisting test is lowered reversely and moreover there occurs a drawback that susceptibility to stress corrosion becomes high.

When both silver and zinc are contained in the copper alloy of the present invention, there can be obtained the following effects, as compared with a copper alloy containing silver or zinc alone. By containing zinc, peeling of plating after heat history of tin plating or tin-lead plating can be inhibited and by containing silver, lowering of solderability after heat history of tin plating or tin-lead plating which is caused by adding a large amount of zinc can be inhibited.

Experimental Examples of EMBODIMENT 1 of the present invention are explained hereinbelow. Compositions and characteristics of copper alloys of each Experimental Example are shown in Tables 1 and 2.

Methods of tests and evaluation of characteristics examined in each Experimental Example are as mentioned below.
(Tensile strength)
  Measured in accordance with JIS Z 2241
(Electrical conductivity)
  Measured in accordance with JIS H 0505
(Adhesion of silver(Ag) plating)
  After pickling of a surface of a test piece, 5 $\mu$m thick silver plating is applied thereto, followed by heating at 450° C. for five minutes. Then 10 $cm^2$ on the surface of the test piece is observed. Blistering in the above-mentioned area and the number of blisters thereof are observed. When the number of blisters is not less than 10, the test piece is assumed to be a defective article, and when there is no blister, the test piece is assumed to be a non-defective article (good). In each Table shown hereinbelow, a defective article is represented by "x", an article having 1 to 9 blisters is represented by "Δ" and a non-defective article is represented by "○".
(Solderability of tin-lead plating after heat resisting test: Ha)
  The test piece subjected to 9/1 solder plating (tin: 90%, lead: 10%) of about 8 $\mu$m thick is heated at 150° C. After 10 hours, 20 hours, 50 hours, 100 hours and every 50 hours after a lapse of 100 hours, respectively from the beginning of the heating with heating at 150° C., each test piece is coated with a flux, and then dipped in a bath with molten 9/1 solder of 240° C., and a dipping time required until a relation of "Buoyancy≦Tension" is obtained is measured through a method by measuring a surface tension. A heating time of the test piece, in which a dipping time required until the buoyancy-tension relation becomes "Buoyancy≦Tension" can be kept within 20 seconds, represents solderability of the tin-lead plating after the heat resisting test. In the Tables, solderability is represented by the heating time.

(Adhesion of tin-lead plating after heat resisting test (Peeling of plating): Hb)

The test piece subjected to 9/1 solder plating of about 8 μm thick is heated at 150° C. and after a lapse of 100 hours and every 100 hours after a lapse of 100 hours with heating at 150° C., followed by 90° V-bending and return bending to observe peeling of the plating. A heating time of the test piece, when peeling of the solder plating occurs on the bend, represents adhesion of the tin-lead plating after the heat resisting test. In the Tables, adhesion is represented by the heating time.

(Life of die in casting)

The life of a die is assumed to be a castable amount until slight cracking or breakout occurs on a surface of an ingot in horizontal continuous casting. The life of a die was measured up to 12 tons/die.

(Ability of primary rolling of ingot)

An ingot after primary rolling is checked to observe whether or not edge cracks or surface cracks occur on a rolled ingot.

EXPERIMENTAL EXAMPLE 1-1

A copper alloy was made from 2.6% by weight of nickel, 0.57% by weight of silicon, 0.080% by weight of silver, 1.92% by weight of zinc and a residual of copper.

In order to examine characteristics of the obtained copper alloy, a test piece was prepared in the manner mentioned below.

A small ingot of the copper alloy having the above-mentioned composition was produced by using a die of 20 mm thick×70 mm wide and then was subjected to the following Step A to give a test piece.

Step A

Ingot→Rolling(0.4 mm)→Solution treatment (800° C., 10 minutes)→Age-hardening treatment (450° C., two hours)→Finish rolling (0.25 mm)

With respect to the obtained test piece of the copper alloy, there were examined tensile strength, electrical conductivity, adhesion of silver plating, solderability of tin-lead plating after the heat resisting test and adhesion of the tin-lead plating after the heat resisting test (peeling of plating). The results were 850 N/mm$^2$, 36% IACS, good(○), 150 hours and not less than 1,000 hours, respectively.

As mentioned above, the results of Experimental Example 1-1 were good, that is, the tensile strength was not less than 650 N/mm$^2$, electrical conductivity was not less than 35% IACS, the solderability was not less than 150 hours and the adhesion was not less than 1,000 hours. Namely, the copper alloy of Experimental Example 1-1 has a good tensile strength and electrical conductivity and is excellent in adhesion of the silver plating and solderability and adhesion of solder after the heat resisting test.

EXPERIMENTAL EXAMPLE 1-2

A copper alloy was made from 2.7% by weight of nickel, 0.63% by weight of silicon, 0.020% by weight of silver, 1.61% by weight of zinc and a residual of copper.

In Experimental Example 1-2, a small ingot was produced in the same manner as in Experimental Example 1-1, and a test piece was produced in accordance with Step A.

With respect to the obtained test piece of the copper alloy, there were examined tensile strength, electrical conductivity, adhesion of silver plating, solderability of tin-lead plating after the heat resisting test and adhesion of the tin-lead plating after the heat resisting test (peeling of plating). The results were 850 N/mm$^2$, 36% IACS, good(○), 150 hours and not less than 1,000 hours, respectively.

As mentioned above, the results of Experimental Example 1-2 were good, that is, the tensile strength was not less than 650 N/mm$^2$, the electrical conductivity was not less than 35% IACS, the solderability was not less than 150 hours and the adhesion was not less than 1,000 hours. Namely, the copper alloy of Experimental Example 1-2 has a good tensile strength and electrical conductivity and is excellent in adhesion of the silver plating and solderability and adhesion of solder after the heat resisting test.

EXPERIMENTAL EXAMPLE 1-3

A copper alloy was made from 2.6% by weight of nickel, 0.63% by weight of silicon, 0.080% by weight of silver, 1.63% by weight of zinc and a residual of copper.

In Experimental Example 1-3, a small ingot was produced in the same manner as in Experimental Example 1-1, and a test piece was produced in accordance with Step A.

With respect to the obtained test piece of the copper alloy, there were examined tensile strength, electrical conductivity, adhesion of silver plating, solderability of tin-lead plating after the heat resisting test and adhesion of the tin-lead plating after the heat resisting test (peeling of plating). The results were 850 N/mm$^2$, 36% IACS, good(○), 150 hours and not less than 1,000 hours, respectively.

As mentioned above, the results of Experimental Example 1-3 were good, that is, the tensile strength was not less than 650 N/mm$^2$, the electrical conductivity was not less than 35% IACS, the solderability was not less than 150 hours and the adhesion was not less than 1,000 hours. Namely, the copper alloy of Experimental Example 1-3 has a good tensile strength and electrical conductivity and is excellent in adhesion of the silver plating and solderability and adhesion of solder after the heat resisting test.

EXPERIMENTAL EXAMPLE 1-4

A copper alloy was made from 2.6% by weight of nickel, 0.62% by weight of silicon, 0.003% by weight of silver, 1.30% by weight of zinc and a residual of copper.

In Experimental Example 1-4, a small ingot was produced in the same manner as in Experimental Example 1-1, and a test piece was produced in accordance with Step A.

With respect to the obtained test piece of the copper alloy, there were examined tensile strength, electrical conductivity, adhesion of silver plating, solderability of tin-lead plating after the heat resisting test and adhesion of the tin-lead plating after the heat resisting test (peeling of plating). The results were 840 N/mm$^2$, 36% IACS, good(○), 150 hours and not less than 1,000 hours, respectively.

As mentioned above, the results of Experimental Example 1-4 were good, that is, the tensile strength was not less than 650 N/mm$^2$, the electrical conductivity was not less than 35% IACS, the solderability was not less than 150 hours and the adhesion was not less than 1,000 hours. Namely, the copper alloy of Experimental Example 1-4 has a good tensile strength and electrical conductivity and is excellent in adhesion of the silver plating and solderability and adhesion of solder after the heat resisting test.

EXPERIMENTAL EXAMPLE 1-5

A copper alloy was made from 2.4% by weight of nickel, 0.60% by weight of silicon, 0.210% by weight of silver, 1.16% by weight of zinc and a residual of copper.

In Experimental Example 1-5, a small ingot was produced in the same manner as in Experimental Example 1-1, and a test piece was produced in accordance with Step A.

With respect to the obtained test piece of the copper alloy, there were examined tensile strength, electrical conductivity, adhesion of silver plating, solderability of tin-lead plating after the heat resisting test and adhesion of the tin-lead plating after the heat resisting test (peeling of plating). The results were 850 N/mm$^2$, 40% IACS, good(○), 300 hours and not less than 1,000 hours, respectively.

As mentioned above, the results of Experimental Example 1-5 were good, that is, the tensile strength was not less than 650 N/mm$^2$, the electrical conductivity was not less than 35% IACS, the solderability was not less than 150 hours and the adhesion was not less than 1,000 hours. Namely, the copper alloy of Experimental Example 1-5 has a good tensile strength and electrical conductivity and is excellent in adhesion of the silver plating and solderability and adhesion of solder after the heat resisting test, particularly a remarkable effect is exhibited with respect to the solderability after the heat resisting test.

EXPERIMENTAL EXAMPLE 1-6

A copper alloy was made from 2.6% by weight of nickel, 0.62% by weight of silicon, 0.200% by weight of silver, 1.81% by weight of zinc and a residual of copper.

In Experimental Example 1-6, a small ingot was produced in the same manner as in Experimental Example 1-1, and a test piece was produced in accordance with Step A.

With respect to the obtained test piece of the copper alloy, there were examined tensile strength, electrical conductivity, adhesion of silver plating, solderability of tin-lead plating after the heat resisting test and adhesion of the tin-lead plating after the heat resisting test (peeling of plating). The results were 850 N/mm$^2$, 36% IACS, good(○), 200 hours and not less than 1,000 hours, respectively.

As mentioned above, the results of Experimental Example 1-6 were good, that is, the tensile strength was not less than 650 N/mm$^2$, the electrical conductivity was not less than 35% IACS, the solderability was not less than 150 hours and the adhesion was not less than 1,000 hours. Namely, the copper alloy of Experimental Example 1-6 has a good tensile strength and electrical conductivity and is excellent in adhesion of the silver plating and solderability and adhesion of solder after the heat resisting test, particularly a remarkable effect is exhibited with respect to the solderability after the heat resisting test.

EXPERIMENTAL EXAMPLE 1-7

A copper alloy was made from 2.6% by weight of nickel, 0.61% by weight of silicon, 0.102% by weight of silver, 0.65% by weight of zinc and a residual of copper.

In Experimental Example 1-7, a small ingot was produced in the same manner as in Experimental Example 1-1, and a test piece was produced in accordance with Step A.

With respect to the obtained test piece of the copper alloy, there were examined tensile strength, electrical conductivity, adhesion of silver plating, solderability of tin-lead plating after the heat resisting test and adhesion of the tin-lead plating after the heat resisting test (peeling of plating). The results were 840 N/mm$^2$, 38% IACS, good(○), 300 hours and not less than 1,000 hours, respectively.

As mentioned above, the results of Experimental Example 1-7 were good, that is, the tensile strength was not less than 650 N/mm$^2$, the electrical conductivity was not less than 35% IACS, the solderability was not less than 150 hours and the adhesion was not less than 1,000 hours. Namely, the copper alloy of Experimental Example 1-7 has a good tensile strength and electrical conductivity and is excellent in adhesion of the silver plating and solderability and adhesion of solder after the heat resisting test, particularly a remarkable effect is exhibited with respect to solderability after the heat resisting test.

EXPERIMENTAL EXAMPLES 1-8 TO 1-21

For comparison with the above-mentioned Experimental Examples 1-1 to 1-7, various amounts of nickel, silicon, silver and zinc were added to copper. Then a small ingot was produced in the same manner as in Experimental Example 1-1 and a test piece of the copper alloy was made in accordance with Step A. In the same manner as in the above-mentioned Experimental Examples, tensile strength, electrical conductivity, adhesion of silver plating and solderability and adhesion (peeling of plating) of tin-lead plating after the heat resisting test were examined.

The results are shown in Tables 1 and 2.

In Experimental Example 1-10, an ingot of 15 mm thick×450 mm wide was produced through horizontal continuous casting and then a test piece was produced in accordance with Step A.

TABLE 1

| Experimental Example | Composition of alloy (% by weight) | | | | | | | | Tensile strength | Electrical conductivity |
|---|---|---|---|---|---|---|---|---|---|---|
| | Cu | Ni | Si | Ag | Zn | Sn | B | Pb | (N/mm$^2$) | (% IACS) |
| 1-1 | Residual | 2.6 | 0.57 | 0.080 | 1.92 | — | — | — | 850 | 36 |
| 1-2 | Residual | 2.7 | 0.63 | 0.020 | 1.61 | — | — | — | 850 | 36 |
| 1-3 | Residual | 2.6 | 0.63 | 0.008 | 1.63 | — | — | — | 850 | 36 |
| 1-4 | Residual | 2.6 | 0.62 | 0.003 | 1.30 | — | — | — | 840 | 36 |
| 1-5 | Residual | 2.4 | 0.60 | 0.210 | 1.16 | — | — | — | 850 | 40 |
| 1-6 | Residual | 2.6 | 0.62 | 0.200 | 1.81 | — | — | — | 850 | 36 |
| 1-7 | Residual | 2.6 | 0.61 | 0.102 | 0.65 | — | — | — | 840 | 38 |
| 1-8 | Residual | 1.2 | 0.22 | — | — | — | — | — | 550 | 47 |
| 1-9 | Residual | 1.8 | 0.51 | — | — | — | — | — | 700 | 44 |
| 1-10 | Residual | 3.5 | 0.73 | — | — | — | — | — | 850 | 39 |

TABLE 1-continued

| | | Cu | Ni | Si | Ag | Zn | Sn | B | Pb | | |
|---|---|---|---|---|---|---|---|---|---|---|---|
| 1-11 | | Residual | 1.8 | 0.44 | 0.003 | — | — | — | — | 700 | 45 |
| 1-12 | | Residual | 1.8 | 0.51 | 0.252 | — | — | — | — | 720 | 45 |
| 1-13 | | Residual | 3.5 | 0.70 | 0.251 | — | — | — | — | 840 | 40 |

| Experimental Example | Adhesion of Ag plating | Life of die (ton/die) | Ability of primary rolling of ingot | Heat resisting test after Sn—Pb plating | | Production step |
|---|---|---|---|---|---|---|
| | | | | Solderability Ha (hour) | Adhesion Hb (hour) | |
| 1-1 | ○ | — | — | 150 | not less than 1,000 | A |
| 1-2 | ○ | — | — | 150 | not less than 1,000 | A |
| 1-3 | ○ | — | — | 150 | not less than 1,000 | A |
| 1-4 | ○ | — | — | 150 | not less than 1,000 | A |
| 1-5 | ○ | — | — | 300 | not less than 1,000 | A |
| 1-6 | ○ | — | — | 200 | not less than 1,000 | A |
| 1-7 | ○ | — | — | 300 | not less than 1,000 | A |
| 1-8 | X | — | — | 100 | 300 | A |
| 1-9 | Δ | — | — | 100 | 200 | A |
| 1-10 | X | 4 | good | 100 | 100 | A |
| 1-11 | ○ | — | — | 200 | 300 | A |
| 1-12 | ○ | — | — | 300 | 300 | A |
| 1-13 | ○ | — | — | 300 | 300 | A |

TABLE 2

| Experimental Example | Composition of alloy (% by weight) | | | | | | | | Tensile strength (N/mm$^2$) | Electrical conductivity (% IACS) |
|---|---|---|---|---|---|---|---|---|---|---|
| | Cu | Ni | Si | Ag | Zn | Sn | B | Pb | | |
| 1-14 | Residual | 1.8 | 0.52 | — | 0.33 | — | — | — | 700 | 43 |
| 1-15 | Residual | 1.8 | 0.54 | — | 1.56 | — | — | — | 710 | 43 |
| 1-16 | Residual | 1.8 | 0.56 | — | 1.82 | — | — | — | 730 | 40 |
| 1-17 | Residual | 3.6 | 0.70 | — | 2.06 | — | — | — | 730 | 37 |
| 1-18 | Residual | 1.8 | 0.38 | 0.003 | 0.28 | — | — | — | 700 | 45 |
| 1-19 | Residual | 2.5 | 0.59 | 0.110 | 0.41 | — | — | — | 830 | 39 |
| 1-20 | Residual | 2.5 | 0.58 | 0.003 | 2.10 | — | — | — | 850 | 34 |
| 1-21 | Residual | 2.6 | 0.64 | 0.001 | 0.69 | — | — | — | 830 | 39 |

| Experimental Example | Adhesion of Ag plating | Life of die (ton/die) | Ability of primary rolling of ingot | Heat resisting test after Sn—Pb plating | | Production step |
|---|---|---|---|---|---|---|
| | | | | Solderability Ha (hour) | Adhesion Hb (hour) | |
| 1-14 | Δ | — | — | 100 | 300 | A |
| 1-15 | ○ | — | — | 50 | 500 | A |
| 1-16 | ○ | — | — | 20 | not less than 1,000 | A |
| 1-17 | ○ | — | — | 20 | not less than 1,000 | A |
| 1-18 | ○ | — | — | 150 | 300 | A |
| 1-19 | ○ | — | — | 300 | 500 | A |
| 1-20 | ○ | — | — | 50 | not less than 1,000 | A |
| 1-21 | ○ | — | — | 100 | not less than 1,000 | A |

As it is clear from Tables 1 and 2, when the nickel content is less than 1.7% by weight and the silicon content is less than 0.3% by weight like in Experimental Example 1-8, the tensile strength is less than 650 N/mm$^2$. To the contrary, the tensile strength in the above-mentioned Experimental Examples 1-1 to 1-7 was good, that is, not less than 650 N/mm$^2$ and thus the reliability with respect to the tensile strength is high.

With respect to the copper alloys which do not contain silver at all like in Experimental Examples 1-8 to 1-10 and 1-14, blistering occurred in the area observed due to poor adhesion of silver plating. To the contrary, in the above-mentioned Experimental Examples 1-1 to 1-7, no blistering occurred and the reliability of the silver plating is high.

Further when no silver is contained like in Experimental Examples 1-8 to 1-10 and 1-14 to 1-17 or when silver is contained in an amount of less than 0.002% by weight like in Experimental Example 1-21, the solderability is less than 150 hours. To the contrary, the solderability in the above-mentioned Experimental Examples 1-1 to 1-7 is good, that is, not less than 150 hours and the reliability of the tin-lead plating is high.

Further when no zinc is contained like in Experimental Examples 1-8 to 1-13 or when zinc is contained in an amount of less than 0.5% by weight like in Experimental Examples 1-14, 1-18, and 1-19, the adhesion is less than 1,000 hours. To the contrary, the adhesion in the above-mentioned Experimental Examples 1-1 to 1-7 is good, that is, not less than 1,000 hours and the reliability of the tin-lead plating is high.

As it is clear from the above-mentioned results, in EMBODIMENT 1 of the present invention, since 1.7 to 4.0% by weight of nickel and 0.3 to 0.8% by weight of silicon and further 0.002 to 0.3% by weight of silver and 0.5 to 2.0% by weight of zinc are added to copper which is a major component, there are obtained effects that good tensile strength and electrical conductivity are maintained, and excellent adhesion of silver plating and excellent solderability and adhesion of solder after the heat resisting test are exhibited.

In addition, as shown in Experimental Examples 1-5 to 1-7, when the silver content is not less than 0.05% by weight (however, not more than 0.3% by weight), there is exhibited an effect that the solderability is remarkably good, that is, not less than 200 hours and the reliability of the tin-lead plating is very high.

EMBODIMENT 2

EMBODIMENT 2 of the present invention relates to a copper alloy which has, when the silver content is assumed to be Y % by weight and the zinc content is assumed to be X % by weight in EMBODIMENT 1, the relation between X and Y represented by the following equation (1):

$$\log Y \geq 2.2X - 5 \qquad (1)$$

In EMBODIMENT 2, when the relation between the silver and zinc contents meets the above-mentioned equation (1), it becomes possible to take full advantage of both merits that the solderability of tin-lead plating is excellent because of addition of silver and that the adhesion of tin plating or tin-lead plating is excellent because of addition of zinc. Particularly remarkable effect is exhibited with respect to the solderability of the tin-lead plating after the heat resisting test.

Explained below are Experimental Examples of EMBODIMENT 2. Alloy compositions and characteristics of each Example are shown in Tables 3 and 4.

EXPERIMENTAL EXAMPLE 2-1

A copper alloy was made from 1.8% by weight of nickel, 0.41% by weight of silicon, 0.003% by weight of silver, 0.61% by weight of zinc and a residual of copper.

In Experimental Example 2-1, a small ingot was produced in the same manner as in Experimental Example 1-1, and a test piece was produced in accordance with Step A.

With respect to the obtained test piece of the copper alloy, there were examined tensile strength, electrical conductivity, adhesion of silver plating, solderability of tin-lead plating after the heat resisting test and adhesion of the tin-lead plating after the heat resisting test (peeling of plating). The results were 710 N/mm², 43% IACS, good(○), 200 hours and not less than 1,000 hours, respectively.

As mentioned above, the results of Experimental Example 2-1 were good, that is, the tensile strength was not less than 650 N/mm², the electrical conductivity was not less than 35% IACS, the solderability was not less that 150 hours and the adhesion was not less than 1,000 hours. Namely, the copper alloy of Experimental Example 2-1 has a good tensile strength and electrical conductivity and is excellent in adhesion of the silver plating and solderability and adhesion of solder after the heat resisting test, particularly a remarkable effect is exhibited with respect to the solderability after the heat resisting test.

EXPERIMENTAL EXAMPLE 2-2

A copper alloy was made from 2.5% by weight of nickel, 0.63% by weight of silicon, 0.005% by weight of silver, 1.02% by weight of zinc and a residual of copper.

In Experimental Example 2-2, an ingot of 15 mm thick× 450 mm wide was produced through horizontal continuous casting, and a test piece was produced in accordance with Step A.

With respect to the obtained test piece of the copper alloy, there were examined tensile strength, electrical conductivity, adhesion of silver plating, solderability of tin-lead plating after the heat resisting test and adhesion of the tin-lead plating after the heat resisting test (peeling of plating). The results were 840 N/mm², 39% IACS, good(○), 200 hours and not less than 1,000 hours, respectively.

As mentioned above, the results of Experimental Example 2-2 were good, that is, the tensile strength was not less than 650 N/mm², the electrical conductivity was not less than 35% IACS, the solderability was not less than 150 hours and the adhesion was not less than 1,000 hours. Namely, the copper alloy of Experimental Example 2-2 has a good tensile strength and electrical conductivity and is excellent in adhesion of the silver plating and solderability and adhesion of solder after the heat resisting test, particularly a remarkable effect is exhibited with respect to the solderability after the heat resisting test.

EXPERIMENTAL EXAMPLE 2-3

The ingot produced in Experimental Example 2-2 was divided and then a test piece was made in accordance with the following Step B. An object of Step B is to keep tensile strength, excellent adhesion of silver plating and excellent solderability and adhesion of solder after the heat resisting test and thus to make the electrical conductivity as high as possible, by changing production process.

Step B

Ingot→Solution treatment(800° C., 10 minutes)
→Rolling→Annealing(550° C., two hours)
→Rolling→Annealing(550° C., two hours)→Finish rolling(0.25 mm)

With respect to the obtained test piece of the copper alloy, there were examined tensile strength, electrical conductivity, adhesion of silver plating, solderability of tin-lead plating after the heat resisting test and adhesion of the tin-lead plating after the heat resisting test (peeling of plating). The results were 650 N/mm², 4.7% IACS, good(○), 200 hours and not less than 1,000 hours, respectively.

As is clear from those results, though the tensile strength in Experimental Example 2-3 is lower than that in Experimental Example 2-2, it is kept at not less than 650 N/mm². The other results were good, that is, the electrical conductivity was improved by 8% IACS, the solderability was not less than 150 hours and the adhesion was not less than 1,000 hours. Namely the copper alloy of Experimental Example 2-3 has a good tensile strength and is excellent in adhesion of the silver plating and solderability and adhesion of solder after the heat resisting test, particularly has a higher electrical conductivity.

EXPERIMENTAL EXAMPLE 2-4

A copper alloy was made from 3.7% by weight of nickel, 0.74% by weight of silicon, 0.012% by weight of silver, 1.03% by weight of zinc and a residual of copper.

In Experimental Example 2-4, a small ingot was produced in the same manner as in Experimental Example 1-1, and a test piece was produced in accordance with Step A.

With respect to the obtained test piece of the copper alloy, there were examined tensile strength, electrical conductivity, adhesion of silver plating, solderability of tin-lead plating after the heat resisting test and adhesion of the tin-lead plating after the heat resisting test (peeling of plating). The results were 880 N/mm$^2$, 38% IACS, good(○), 200 hours and not less than 1,000 hours, respectively.

As mentioned above, the results of Experimental Example 2-4 were good, that is, the tensile strength was not less than 650 N/mm$^2$, the electrical conductivity was not less than 35% IACS, the solderability was not less than 150 hours and the adhesion was not less than 1,000 hours. Namely, the copper alloy of Experimental Example 2-4 has a good tensile strength and electrical conductivity and is excellent in adhesion of the silver plating and solderability and adhesion of solder after the heat resisting test, particularly a remarkable effect is exhibited with respect to the solderability after the heat resisting test.

EXPERIMENTAL EXAMPLE 2-5

A copper alloy was made from 2.5% by weight of nickel, 0.65% by weight of silicon, 0.020% by weight of silver, 1.31% by weight of zinc and a residual of copper.

In Experimental Example 2-5, a small ingot was produced in the same manner as in Experimental Example 1-1, and a test piece was produced in accordance with Step A.

With respect to the obtained test piece of the copper alloy, there were examined tensile strength, electrical conductivity, adhesion of silver plating, solderability of tin-lead plating after the heat resisting test and adhesion of the tin-lead plating after the heat resisting test (peeling of plating). The results were 850 N/mm$^2$, 37% IACS, good(○), 200 hours and not less than 1,000 hours, respectively.

As mentioned above, the results of Experimental Example 2-5 were good, that is, the tensile strength was not less than 650 N/mm$^2$, the electrical conductivity was not less than 35% IACS, the solderability was not less than 150 hours and the adhesion was not less than 1,000 hours. Namely, the copper alloy of Experimental Example 2-5 has a good tensile strength and electrical conductivity and is excellent in adhesion of the silver plating and solderability and adhesion of solder after the heat resisting test, particularly a remarkable effect is exhibited with respect to the solderability after the heat resisting test.

Experimental Examples 1-5, 1-6 and 1-7 of EMBODIMENT 1 meet the conditions of Experimental Example 2 and the results thereof are also shown in Tables 3 and 4.

TABLE 3

| Experimental Example | Composition of alloy (% by weight) | | | | | | | | Whether the equation log Y ≦ 2.2X − 5 is met | Tensile strength (N/mm$^2$) | Electrical conductivity (% IACS) |
|---|---|---|---|---|---|---|---|---|---|---|---|
| | Cu | Ni | Si | Ag | Zn | Sn | B | Pb | | | |
| 2-1 | Residual | 1.8 | 0.41 | 0.003 | 0.61 | — | — | — | ○ | 710 | 43 |
| 2-2 | Residual | 2.5 | 0.63 | 0.005 | 1.02 | — | — | — | ○ | 840 | 39 |
| 2-3 | Residual | 2.5 | 0.63 | 0.005 | 1.02 | — | — | — | ○ | 650 | 47 |
| 2-4 | Residual | 3.7 | 0.74 | 0.012 | 1.03 | — | — | — | ○ | 880 | 38 |
| 2-5 | Residual | 2.5 | 0.65 | 0.020 | 1.31 | — | — | — | ○ | 850 | 37 |
| 1-5 | Residual | 2.4 | 0.60 | 0.210 | 1.16 | — | — | — | ○ | 850 | 40 |
| 1-6 | Residual | 2.6 | 0.62 | 0.200 | 1.81 | — | — | — | ○ | 850 | 36 |
| 1-7 | Residual | 2.6 | 0.61 | 0.102 | 0.65 | — | — | — | ○ | 840 | 38 |
| 1-8 | Residual | 1.2 | 0.22 | — | — | — | — | — | X | 550 | 47 |
| 1-9 | Residual | 1.8 | 0.51 | — | — | — | — | — | X | 700 | 44 |
| 1-10 | Residual | 3.5 | 0.73 | — | — | — | — | — | X | 850 | 39 |
| 1-11 | Residual | 1.8 | 0.44 | 0.003 | — | — | — | — | X | 700 | 45 |
| 1-12 | Residual | 1.8 | 0.51 | 0.252 | — | — | — | — | X | 720 | 45 |

| Experimental Example | Adhesion of Ag plating | Life of die (ton/die) | Ability of primary rolling of ingot | Heat resisting test after Sn—Pb plating | | Production step |
|---|---|---|---|---|---|---|
| | | | | Solderability Ha (hour) | Adhesion Hb (hour) | |
| 2-1 | ○ | — | — | 200 | not less than 1,000 | A |
| 2-2 | ○ | 8 | good | 200 | not less than 1,000 | A |
| 2-3 | ○ | 8 | good | 200 | not less than 1,000 | B |
| 2-4 | ○ | — | — | 200 | not less than 1,000 | A |
| 2-5 | ○ | — | — | 200 | not less than 1,000 | A |
| 1-5 | ○ | — | — | 300 | not less than 1,000 | A |

TABLE 3-continued

| | | | | | | |
|---|---|---|---|---|---|---|
| 1-6 | ○ | — | — | 200 | not less than 1,000 | A |
| 1-7 | ○ | — | — | 300 | not less than 1,000 | A |
| 1-8 | X | — | — | 100 | 300 | A |
| 1-9 | Δ | — | — | 100 | 200 | A |
| 1-10 | X | 4 | good | 100 | 100 | A |
| 1-11 | ○ | — | — | 200 | 300 | A |
| 1-12 | ○ | — | — | 300 | 300 | A |

TABLE 4

| Experimental Example | Composition of alloy (% by weight) | | | | | | | | Whether the equation $\log Y \leq 2.2X - 5$ is met | Tensile strength (N/mm$^2$) | Electrical conductivity (% IACS) |
|---|---|---|---|---|---|---|---|---|---|---|---|
| | Cu | Ni | Si | Ag | Zn | Sn | B | Pb | | | |
| 1-13 | Residual | 3.5 | 0.70 | 0.251 | — | — | — | — | X | 840 | 40 |
| 1-14 | Residual | 1.8 | 0.52 | — | 0.33 | — | — | — | X | 700 | 43 |
| 1-15 | Residual | 1.8 | 0.54 | — | 0.56 | — | — | — | X | 710 | 43 |
| 1-16 | Residual | 1.8 | 0.56 | — | 1.82 | — | — | — | X | 730 | 40 |
| 1-17 | Residual | 3.6 | 0.70 | — | 2.06 | — | — | — | X | 730 | 37 |
| 1-18 | Residual | 1.8 | 0.38 | 0.003 | 0.28 | — | — | — | ○ | 700 | 45 |
| 1-19 | Residual | 2.5 | 0.59 | 0.110 | 0.41 | — | — | — | ○ | 830 | 39 |
| 1-20 | Residual | 2.5 | 0.58 | 0.003 | 2.10 | — | — | — | X | 850 | 34 |
| 1-21 | Residual | 2.6 | 0.64 | 0.001 | 0.69 | — | — | — | ○ | 830 | 39 |

| Experimental Example | Adhesion of Ag plating | Life of die (ton/die) | Ability of primary rolling of ingot | Heat resisting test after Sn—Pb plating | | Production step |
|---|---|---|---|---|---|---|
| | | | | Solderability Ha (hour) | Adhesion Hb (hour) | |
| 1-13 | ○ | — | — | 300 | 300 | A |
| 1-14 | Δ | — | — | 100 | 300 | A |
| 1-15 | ○ | — | — | 50 | 500 | A |
| 1-16 | ○ | — | — | 20 | not less than 1,000 | A |
| 1-17 | ○ | — | — | 20 | not less than 1,000 | A |
| 1-18 | ○ | — | — | 150 | 300 | A |
| 1-19 | ○ | — | — | 300 | 500 | A |
| 1-20 | ○ | — | — | 50 | not less than 1,000 | A |
| 1-21 | ○ | — | — | 100 | not less than 1,000 | A |

For the purpose of comparing with the above-mentioned Experimental Examples 2-1 to 2-5 and Experimental Examples 1-5 to 1-7, the results of Experimental Examples 1-8 to 1-21 are again shown in Tables 3 and 4.

As is clear from Tables 3 and 4, in Experimental Examples 1-5 to 1-7 and 2-1 to 2-5, the zinc content X is within the range of from 0.5 to 2.0% by weight, the silver content Y is within the range of from 0.002 to 0.3% by weight and X and Y are within the range satisfying the equation of $\log Y \geq 2.2X-5$. When X, Y and the relation thereof are in the ranges mentioned above, the above-mentioned specific effects are exhibited. In Experimental Examples 1-8 to 1-17 and 1-20 where X, Y and the relation thereof are out of the ranges mentioned above, the specific effects are not obtained.

The relational equation of $\log Y \geq 2.2X-5$ approximately indicates a boundary between the more reliable region where solderability obtained after the heat resisting test can be not less than 200 hours and the region where solderability of not less than 150 hours and less than 200 hours is obtained, when the zinc content is within the range of from 0.5 to 2.0% by weight and the silver content is within the range of from 0.002 to 0.3% by weight.

As mentioned above, in EMBODIMENT 2 of the present invention, the copper alloy is prepared by adding, to copper which is a major component, 1.7 to 4.0% by weight of nickel, 0.3 to 0.8% by weight of silicon and further 0.002 to 0.3% by weight of silver (preferably from 0.05 to 0.3% by weight) and 0.5 to 2.0% by weight of zinc, and the relation of the silver content (Y % by weight) and the zinc content (X % by weight) meets the equation of $\log Y \geq 2.2X-5$. Therefore, the obtained copper alloy maintains good tensile strength and electrical conductivity and is excellent in adhesion of silver plating and solderability and adhesion of solder after the heat resisting test like in the above-mentioned EMBODIMENT 1. Particularly in EMBODIMENT 2, the solderability after the heat resisting test is as high as not less than 200 hours, thus giving an effect of exhibiting a high reliability of tin-lead plating.

EMBODIMENT 3

EMBODIMENT 3 of the present invention relates to the copper alloy for electronic parts which consists essentially of copper as a major component, 1.7 to 4.0% by weight of nickel(Ni), 0.3 to 0.8% by weight of silicon(Si), 0.002 to 0.3% by weight, preferably 0.05 to 0.3% by weight of silver(Ag), 0.5 to 2.0% by weight of zinc(Zn) and further 0.0005 to 0.01% by weight of boron(B), wherein the relation of the zinc content (X % by weight) and the silver content (Y % by weight) meets the equation of log Y≧2.2X−5.

In EMBODIMENT 3, an object of adding boron is to improve horizontal continuous castability of the copper alloy from production point of view.

The horizontal continuous castability means that a large number of ingots free of slight cracking or breakout on the surface thereof can be obtained in one die. When boron is not contained, the castability, namely, life of a die becomes short, and therefore is required to be improved.

The boron content suitable for improving the horizontal continuous castability is from 0.0005 to 0.01% by weight, particularly from 0.0007 to 0.007% by weight.

Namely when the boron content is less than 0.0005% by weight, improvement of life of a graphite die cannot be recognized.

When the boron content is larger than 0.01% by weight, cracking of the ingot occurs in primary rolling.

Explained below are Experimental Examples of EMBODIMENT 3 of the present invention. Alloy compositions and characteristics in each Experimental Example are shown in Table 5.

EXPERIMENTAL EXAMPLE 3-1

A copper alloy was made from 2.5% by weight of nickel, 0.64% by weight of silicon, 0.008% by weight of silver, 1.00% by weight of zinc, 0.0007% by weight of boron and a residual of copper.

In Experimental Example 3-1, the relation of the silver content (Y % by weight) and the zinc content (X % by weight) meets the equation of log Y≧2.2X−5.

In Experimental Example 3-1, an ingot of 15 mm thick by 450 mm wide was produced through horizontal continuous casting, and a test piece was produced in accordance with Step A.

With respect to the obtained test piece of the copper alloy, there were examined tensile strength, electrical conductivity, adhesion of silver plating, life of a die in casting, ability of primary rolling of the ingot, solderability of tin-lead plating after the heat resisting test and adhesion of the tin-lead plating after the heat resisting test (peeling of plating). The results were 850 N/mm$^2$, 39% IACS, good(○), 10 tons/die, good, 150 hours and not less than 1,000 hours, respectively.

As mentioned above, the results of Experimental Example 3-1 were good, that is, the tensile strength was not less than 650 N/mm$^2$, the electrical conductivity was not less than 35% IACS, the life of the die was not less than 8 tons/die, the solderability was not less than 150 hours and the adhesion was not less than 1,000 hours. Namely, the copper alloy of Experimental Example 3-1 has a good tensile strength and electrical conductivity and is excellent in adhesion of silver plating and solderability and adhesion of solder after the heat resisting test, and in addition, the life of the graphite die can be extended.

The life of the graphite die is assumed to be a castable amount until slight cracking or breakout occurs on a surface of an ingot produced through horizontal continuous casting, and the life of the die was measured up to 12 tons.

Ability of primary rolling of the ingot is evaluated to be "good" when neither edge cracks nor surface cracks occur on a rolled ingot, and is evaluated to be "cracking occurred" when the edge cracks or surface cracks occur on a rolled ingot.

EXPERIMENTAL EXAMPLE 3-2

A copper alloy was made from 2.5% by weight of nickel, 0.65% by weight of silicon, 0.008% by weight of silver, 1.04% by weight of zinc, 0.0072% by weight of boron and a residual of copper.

In Experimental Example 3-2, the relation of the silver content (Y % by weight) and the zinc content (X % by weight) meets the equation of log Y≧2.2X−5.

In Experimental Example 3-2, an ingot was produced in the same manner as in the above-mentioned Experimental Example 3-1, and a test piece was produced in accordance with Step A.

With respect to the obtained test piece of the copper alloy, there were examined tensile strength, electrical conductivity, adhesion of silver plating, life of a die, ability of primary rolling of the ingot, solderability of tin-lead plating after the heat resisting test and adhesion of the tin-lead plating after the heat resisting test (peeling of plating). The results were 840 N/mm$^2$, 38% IACS, good(○), not less than 12 tons/die, good, 150 hours and not less than 1,000 hours, respectively.

As mentioned above, the results of Experimental Example 3-2 were good, that is, the tensile strength was not less than 650 N/mm$^2$, the electrical conductivity was not less than 35% IACS, the life of the die was not less than 8 tons/die, the solderability was not less than 150 hours and the adhesion was not less than 1,000 hours. Namely, the copper alloy of Experimental Example 3-2 has a good tensile strength and electrical conductivity and is excellent in adhesion of the silver plating and solderability and adhesion of solder after the heat resisting test, and in addition, the life of the graphite die can be extended.

EXPERIMENTAL EXAMPLES 3-3 AND 3-4

For comparing with Experimental Examples 3-1 and 3-2, amounts of nickel, silicon, silver, zinc and boron added to copper were changed as shown in Table 5, and an ingot was produced in the same manner as in Experimental Example 3-1 and test pieces of copper alloy were produced in accordance with Step A (Experimental Examples 3-3 and 3-4). With respect to the obtained test pieces of copper alloy, there were examined tensile strength, electrical conductivity, adhesion of silver plating, life of a die, ability of primary rolling of the ingot, solderability of tin-lead plating after the heat resisting test and adhesion of the tin-lead plating after the heat resisting test (peeling of plating).

The results are shown in Table 5.

TABLE 5

| Experimental Example | Composition of alloy (% by weight) | | | | | | | | Whether the equation log Y ≧ 2.2X − 5 is met | Tensile strength (N/mm$^2$) | Electrical conductivity (% IACS) |
|---|---|---|---|---|---|---|---|---|---|---|---|
| | Cu | Ni | Si | Ag | Zn | Sn | B | Pb | | | |
| 3-1 | Residual | 2.5 | 0.64 | 0.008 | 1.00 | — | 0.0007 | — | ○ | 850 | 39 |
| 3-2 | Residual | 2.5 | 0.65 | 0.008 | 1.04 | — | 0.0072 | — | ○ | 840 | 38 |

TABLE 5-continued

| | | | | | | | | | | | |
|---|---|---|---|---|---|---|---|---|---|---|---|
| 3-3 | Residual | 2.6 | 0.59 | 0.009 | 1.05 | — | 0.0150 | — | ○ | — | — |
| 3-4 | Residual | 3.5 | 0.73 | — | — | — | — | — | — | 850 | 39 |

| Experimental Example | Adhesion of Ag plating | Life of die (ton/die) | Ability of primary rolling of ingot | Heat resisting test after Sn—Pb plating | | Production step |
|---|---|---|---|---|---|---|
| | | | | Solderability Ha (hour) | Adhesion Hb (hour) | |
| 3-1 | ○ | 10 | good | 150 | not less than 1,000 | A |
| 3-2 | ○ | not less than 12 | good | 150 | not less than 1,000 | A |
| 3-3 | — | 3 | cracking occurred | — | — | — |
| 3-4 | X | 4 | good | 100 | 100 | A |

As is clear from Table 5, when no boron is contained like in Experimental Example 3-4, the life of the die is less than 10 tons/die. In the above-mentioned Experimental Examples 3-1 and 3-2, the life of the die was good, that is, not less than 10 tons/die.

When boron was contained in an amount of more than 0.01% by weight like in Experimental Example 3-3, cracking of the ingot occurred in the primary rolling, but in Experimental Examples 3-1 and 3-2, there occurred no cracking.

As is clear from the above-mentioned results, in EMBODIMENT 3 of the present invention, to copper which is a major component are added 1.7 to 4.0% by weight of nickel, 0.3 to 0.8% by weight of silicon and further 0.002 to 0.3% by weight (preferably from 0.05 to 0.3% by weight) of silver, 0.5 to 2.0% by weight of zinc and 0.0005 to 0.01% by weight of boron, and preferably the relation of the zinc content (X % by weight) and the silver content (Y % by weight) meets the equation of log Y≧2.2X−5. Therefore as explained in EMBODIMENTS 1 and 2, there are obtained effects that the tensile strength and electrical conductivity are maintained, that the adhesion of the silver plating and solderability and adhesion of solder after the heat resisting test can become excellent and that the life of the graphite die can be increased.

EMBODIMENT 4

EMBODIMENT 4 of the present invention relates to the copper alloy for electronic parts which consists essentially of copper as a major component, 1.7 to 4.0% by weight of nickel(Ni), 0.3 to 0.8% by weight of silicon(Si), 0.002 to 0.3% by weight (preferably from 0.05 to 0.3% by weight) of silver(Ag), 0.5 to 2.0% by weight of zinc(Zn) (Preferably the relation of the zinc content (X % by weight) and the silver content (Y % by weight) meets the equation of log Y≧2.2X−5) and further 0.1 to 0.4% by weight of tin(Sn) or the copper alloy for electronic parts which consists essentially of copper as a major component, 1.7 to 4.0% by weight of nickel(Ni), 0.3 to 0.8% by weight of silicon(Si), 0.002 to 0.3% by weight (preferably from 0.05 to 0.3% by weight) of silver(Ag), 0.5 to 2.0% by weight of zinc(Zn) (Preferably the relation of the zinc content (X % by weight) and the silver content (Y % by weight) meets the equation of log Y≧2.2X−5) and further 0.0005 to 0.01% by weight of boron(B) and 0.1 to 0.4% by weight of tin(Sn).

In EMBODIMENT 4, an object of adding tin (from 0.1 to 0.4% by weight, particularly from 0.1 to 0.3% by weight) is to strengthen a copper-nickel-silicon system copper alloy.

Also another object of EMBODIMENT 4 is to recover scraps of tin-plated articles, many of which are used on connectors, for the purpose of effective use of material resources.

When the tin content is less than 0.1% by weight, almost no improvement is recognized with respect to strength of the copper alloy.

When the tin content is more than 0.4% by weight, the electrical conductivity of the copper alloy is lowered.

Explained below are Experimental Examples of EMBODIMENT 4. The compositions and characteristics of the copper alloy are shown in Table 6.

EXPERIMENTAL EXAMPLE 4-1

A copper alloy was made from 2.5% by weight of nickel, 0.65% by weight of silicon, 0.071% by weight of silver, 1.03% by weight of zinc, 0.13% by weight of tin and a residual of copper.

In Experimental Example 4-1, the relation of the silver content (Y % by weight) and the zinc content (X % by weight) meets the equation of log Y≧2.2X−5.

In Experimental Example 4-1, an ingot of 15 mm thick× 450 mm wide was produced through horizontal continuous casting, and a test piece was produced in accordance with Step A.

With respect to the obtained test piece of the copper alloy, there were examined tensile strength, electrical conductivity, adhesion of silver plating, life of a die, ability of primary rolling of the ingot, solderability of tin-lead plating after the heat resisting test and adhesion of the tin-lead plating after the heat resisting test (peeling of plating). The results were 860 N/mm$^2$, 38% IACS, good(○), 8 tons/die, good, 200 hours and not less than 1,000 hours, respectively.

As mentioned above, the results of Experimental Example 4-1 were good, that is, the tensile strength was not less than 650 N/mm$^2$, the electrical conductivity was not less than 35% IACS, the life of the die was not less than 8 tons/die, the solderability was not less than 150 hours and the adhesion was not less than 1,000 hours. Namely, the copper alloy of Experimental Example 4-1 has a good tensile strength and electrical conductivity and is excellent in adhesion of the silver plating and solderability and adhesion of solder after the heat resisting test, and in addition, the life of the graphite die can be increased and the strength of the copper alloy is improved.

Also scraps of the tin-plated article can be recycled depending on applications of the copper alloy.

EXPERIMENTAL EXAMPLE 4-2

A copper alloy was made from 2.4% by weight of nickel, 0.61% by weight of silicon, 0.062% by weight of silver, 0.98% by weight of zinc, 0.34% by weight of tin and a residual of copper.

In Experimental Example 4-2, the relation of the silver content (Y % by weight) and the zinc content (X % by weight) meets the equation of log Y≧2.2X−5.

In Experimental Example 4-2, a small ingot was produced in the same manner as in Experimental Example 1-1, and a test piece was produced in accordance with Step A.

With respect to the obtained test piece of the copper alloy, there were examined tensile strength, electrical conductivity, adhesion of silver plating, solderability of tin-lead plating after the heat resisting test and adhesion of the tin-lead plating after the heat resisting test (peeling of plating). The results were 870 N/mm$^2$, 36% IACS, good(○), 200 hours and not less than 1,000 hours, respectively.

As mentioned above, the results of Experimental Example 4-2 were good, that is, the tensile strength was not less than 650 N/mm$^2$, the electrical conductivity was not less than 35% IACS, the solderability was not less than 150 hours and the adhesion was not less than 1,000 hours. Namely, the copper alloy of Experimental Example 4-2 has a good tensile strength and electrical conductivity and is excellent in adhesion of the silver plating and solderability and adhesion of solder after the heat resisting test, and in addition, the strength of the copper alloy is improved.

Also scraps of the tin-plated article can be recycled depending on applications of the copper alloy.

EXPERIMENTAL EXAMPLE 4-3

A copper alloy was made from 2.5% by weight of nickel, 0.62% by weight of silicon, 0.008% by weight of silver, 0.99% by weight of zinc, 0.0008% by weight of boron(B), 0.18% by weight of tin and a residual of copper.

In Experimental Example 4-3, the relation of the silver content (Y % by weight) and the zinc content (X % by weight) meets the equation of log Y≧2.2X−5.

In Experimental Example 4-3, an ingot was produced in the same manner as in Experimental Example 4-1, and a test piece was produced in accordance with Step A.

With respect to the obtained test piece of the copper alloy, there were examined tensile strength, electrical conductivity, adhesion of silver plating, life of a die, ability of primary rolling of the ingot, solderability of the tin-lead plating after the heat resisting test and adhesion of tin-lead plating after the heat resisting test (peeling of plating). The results were 860 N/mm$^2$, 38% IACS, good(○), 10 tons/die, good, 150 hours and not less than 1,000 hours, respectively.

As mentioned above, the results of Experimental Example 4-3 were good, that is, the tensile strength was not less than 650 N/mm$^2$, the electrical conductivity was not less than 35% IACS, the life of a die was not less than 8 tons/die, the solderability was not less than 150 hours and the adhesion was not less than 1,000 hours. Namely, the copper alloy of Experimental Example 4-3 has a good tensile strength and electrical conductivity and is excellent in adhesion of the silver plating and solderability and adhesion of solder after the heat resisting test, and in addition, the life of a graphite die can be increased and the strength of the copper alloy is improved.

Also scraps of the tin-plated article can be recycled depending on applications of the copper alloy.

EXPERIMENTAL EXAMPLE 4-4

A copper alloy was made from 2.5% by weight of nickel, 0.66% by weight of silicon, 0.007% by weight of silver, 1.02% by weight of zinc, 0.0063% by weight of boron(B), 0.19% by weight of tin and a residual of copper.

In Experimental Example 4-4, the relation of the silver content (Y % by weight) and the zinc content (X % by weight) meets the equation of log Y≧2.2X−5.

In Experimental Example 4-4, an ingot was produced in the same manner as in Experimental Example 4-1, and a test piece was produced in accordance with Step A.

With respect to the obtained test piece of the copper alloy, there were examined tensile strength, electrical conductivity, adhesion of silver plating, life of a die, ability of primary rolling of the ingot, solderability of tin-lead plating after the heat resisting test and adhesion of the tin-lead plating after the heat resisting test (peeling of plating). The results were 850 N/mm$^2$, 38% IACS, good(○), not less than 12 tons/die, good, 150 hours and not less than 1,000 hours, respectively.

As mentioned above, the results of Experimental Example 4-4 were good, that is, the tensile strength was not less than 650 N/mm$^2$, the electrical conductivity was not less than 35% IACS, the life of a die was not less than 8 tons/die, the solderability was not less than 150 hours and the adhesion was not less than 1,000 hours. Namely, the copper alloy of Experimental Example 4-4 has a good tensile strength and electrical conductivity and is excellent in adhesion of the silver plating and solderability and adhesion of solder after the heat resisting test, and in addition, the life of a graphite die can be increased and the strength of the copper alloy is improved.

Also scraps of the tin-plated article can be recycled depending on applications of the copper alloy.

EXPERIMENTAL EXAMPLE 4-5

An ingot produced in Experimental Example 4-4, was divided, and a test piece was produced in accordance with Step B in the same way as explained in Experimental Example 2-3.

In Experimental Example 4-5, the relation of the silver content (Y % by weight) and the zinc content (X % by weight) meets the equation of log Y≧2.2X−5.

With respect to the obtained test piece of the copper alloy, there were examined tensile strength, electrical conductivity, adhesion of silver plating, solderability of tin-lead plating after the heat resisting test and adhesion of the tin-lead plating after the heat resisting test (peeling of plating). The results were 660 N/mm$^2$, 46% IACS, good(○), 300 hours and not less than 1,000 hours, respectively.

As is clear from the results of Experimental Example 4-5, the tensile strength was lower than that of Experimental Example 4-4 but maintained at not less than 650 N/mm$^2$, the electrical conductivity was not less than 35% IACS and was improved by 8% IACS as compared with Experimental Example 4-4, the solderability was not less than 150 hours and the adhesion was not less than 1,000 hours, and thus the results were good. Namely, the copper alloy of Experimental Example 4-5 has a good tensile strength and is excellent in adhesion of the silver plating and solderability and adhesion of solder after the heat resisting test, and in addition, has a higher electrical conductivity.

Also scraps of the tin-plated article can be recycled depending on applications of the copper alloy.

EXPERIMENTAL EXAMPLES 4-6 AND 4-7

For comparing with Experimental Examples 4-1 to 4-5, amounts of nickel, silicon, silver, zinc, boron and tin added to copper were changed as shown in Table 6, and an ingot was produced in the same manner as in Experimental Example 1-1 and test pieces of a copper alloy were produced in accordance with Step A. With respect to the obtained test pieces of the copper alloy, there were examined tensile strength, electrical conductivity, adhesion of silver plating, life of a die, ability of primary rolling of the ingot, solderability of tin-lead plating after the heat resisting test and adhesion of the tin-lead plating after the heat resisting test (peeling of plating).

The results are shown in Table 6.

conductivity are maintained, that the adhesion of silver plating and solderability and adhesion of solder after the heat resisting test are excellent, that strength of copper alloy is improved and that the life of the graphite die can be extended when boron is contained.

EMBODIMENT 5

EMBODIMENT 5 of the present invention relates to the copper alloy for electronic parts which consists essentially of copper as a major component, 1.7 to 4.0% by weight of

TABLE 6

| Experimental Example | Composition of alloy (% by weight) | | | | | | | | Whether the equation log Y ≦ 2.2X − 5 is met | Tensile strength (N/mm²) | Electrical conductivity (% IACS) |
| --- | --- | --- | --- | --- | --- | --- | --- | --- | --- | --- | --- |
| | Cu | Ni | Si | Ag | Zn | Sn | B | Pb | | | |
| 4-1 | Residual | 2.5 | 0.65 | 0.071 | 1.03 | 0.13 | — | — | ○ | 860 | 38 |
| 4-2 | Residual | 2.4 | 0.61 | 0.062 | 0.98 | 0.34 | — | — | ○ | 870 | 36 |
| 4-3 | Residual | 2.5 | 0.62 | 0.008 | 0.99 | 0.18 | 0.0008 | — | ○ | 860 | 38 |
| 4-4 | Residual | 2.5 | 0.66 | 0.007 | 1.02 | 0.19 | 0.0063 | — | ○ | 850 | 38 |
| 4-5 | Residual | 2.5 | 0.66 | 0.007 | 1.02 | 0.19 | 0.0063 | — | ○ | 660 | 46 |
| 4-6 | Residual | 2.6 | 0.59 | 0.70 | 1.03 | 0.51 | — | — | ○ | 880 | 32 |
| 4-7 | Residual | 2.6 | 0.64 | 0.001 | 0.69 | — | — | — | ○ | 830 | 39 |

| Experimental Example | Adhesion of Ag plating | Life of die (ton/die) | Ability of primary rolling of ingot | Heat resisting test after Sn—Pb plating | | Production step |
| --- | --- | --- | --- | --- | --- | --- |
| | | | | Solderability Ha (hour) | Adhesion Hb (hour) | |
| 4-1 | ○ | 8 | good | 200 | not less than 1,000 | A |
| 4-2 | ○ | — | — | 200 | not less than 1,000 | A |
| 4-3 | ○ | 10 | good | 150 | not less than 1,000 | A |
| 4-4 | ○ | not less than 12 | good | 150 | not less than 1,000 | A |
| 4-5 | ○ | not less than 12 | good | 300 | not less than 1,000 | B |
| 4-6 | ○ | — | — | 200 | not less than 1,000 | A |
| 4-7 | ○ | — | — | 100 | not less than 1,000 | A |

As is clear from Table 6, Experimental Examples 4-1 to 4-4 where the same Step A as in Experimental Example 4-7 was employed exhibit the improved strength as compared with Experimental Example 4-7 where no tin was contained.

When tin is contained in an amount of more than 0.4% by weight like in Experimental Example 4-6, the electrical conductivity is less than 35% IACS. In Experimental Examples 4-1 to 4-5, the electrical conductivity is not less than 35% IACS and is more excellent.

As is clear from the above-mentioned results, in EMBODIMENT 4 of the present invention, to copper which is a major component are added 1.7 to 4.0% by weight of nickel, 0.3 to 0.8% by weight of silicon, 0.002 to 0.3% by weight (preferably from 0.05 to 0.3% by weight) of silver, 0.5 to 2.0% by weight of zinc(Zn) (Preferably the relation of the zinc content (X % by weight) and the silver content (Y % by weight) meets the equation of log Y≧2.2X−5) and 0.1 to 0.4% by weight of tin(Sn), or 1.7 to 4.0% by weight of nickel, 0.3 to 0.8% by weight of silicon, 0.002 to 0.3% by weight (preferably from 0.05 to 0.3% by weight) of silver, 0.5 to 2.0% by weight of zinc (Preferably the relation of the zinc content (X % by weight) and the silver content (Y % by weight) meets the equation of log Y≧2.2−5), 0.0005 to 0.01% by weight of boron and 0.1 to 0.4% by weight of tin. Therefore as explained in EMBODIMENTS 1 and 2, there are obtained effects that the tensile strength and electrical nickel(Ni), 0.3 to 0.8% by weight of silicon(Si), 0.002 to 0.3% by weight (preferably from 0.05 to 0.3% by weight) of silver(Ag), 0.5 to 2.0% by weight of zinc(Zn) (Preferably the relation of the zinc content (X % by weight) and the silver content (Y % by weight) meets the equation of log Y≧2.2X−5) and 0.001 to 0.01% by weight of lead(Pb) or the copper alloy for electronic parts which consists essentially of copper as a major component, 1.7 to 4.0% by weight of nickel(Ni), 0.3 to 0.8% by weight of silicon(Si), 0.002 to 0.3% by weight. (preferably from 0.05 to 0.3% by weight) of silver(Ag), 0.5 to 2.0% by weight of zinc(Zn) (Preferably the relation of the zinc content (X % by weight) and the silver content (Y % by weight) meets the equation of log Y≧2.2X−5), 0.0005 to 0.01% by weight of boron(B) and 0.001 to 0.01% by weight of lead(Pb).

In EMBODIMENT 5, an object of adding lead (from 0.001 to 0.01% by weight, particularly from 0.001 to 0.080% by weight) is to improve life of a die in stamping of copper alloy.

In general, addition of lead(Pb) to a copper alloy increases ability of free cutting. Such an alloy is used practically as a free cutting alloy such as series of brass or nickel silver, and the improvement of the life of a die used in stamping is recognized. A minimum lead(Pb) content which can be analyzed and regulated is assumed to be 0.001% by weight, and an upper limit of the lead(Pb) content was determined according to producibility.

Namely when the lead(Pb) content exceeded 0.01% by weight, cracking occurred in the primary rolling of an ingot.

Explained below are Experimental Examples of EMBODIMENT 5. Compositions and characteristics of alloys are shown in Table 7.

EXPERIMENTAL EXAMPLE 5-1

A copper alloy was made from 2.5% by weight of nickel, 0.61% by weight of silicon, 0.011% by weight of silver, 1.02% by weight of zinc, 0.0046% by weight of boron, 0.002% by weight of lead and a residual of copper.

In Experimental Example 5-1, the relation of the silver content (Y % by weight) and the zinc content (X % by weight) meets the equation of $\log Y \geq 2.2X-5$.

In Experimental Example 5-1, a small ingot was produced in the same manner as in the above-mentioned Experimental Example 1-1 and a test piece was produced in accordance with Step A.

With respect to the obtained test piece of the copper alloy, there were examined tensile strength, electrical conductivity, adhesion of silver plating, solderability of tin-lead plating after the heat resisting test and adhesion of the tin-lead plating after the heat resisting test (peeling of plating). The results were 840 N/mm$^2$, 37% IACS, good(○), 200 hours and not less than 1,000 hours, respectively.

As mentioned above, the results of Experimental Example 5-1 were good, that is, the tensile strength was not less than 650 N/mm$^2$, the electrical conductivity was not less than 35% IACS, the solderability was not less than 150 hours and the adhesion was not less than 1,000 hours. Namely, the copper alloy of Experimental Example 5-1 has a good tensile strength and electrical conductivity and is excellent in adhesion of the silver plating and solderability and adhesion of solder after the heat resisting test, and in addition, the life of a die in stamping can be increased.

EXPERIMENTAL EXAMPLE 5-2

A copper alloy was made from 2.5% by weight of nickel, 0.64% by weight of silicon, 0.009% by weight of silver, 1.03% by weight of zinc, 54% by weight of boron, 0.009% by weight of lead and a residual of copper.

In Experimental Example 5-2, the relation of the silver content (Y % by weight) and the zinc content (X % by weight) meets the equation of $\log Y \geq 2.2X-5$.

In Experimental Example 5-2, an ingot was produced through horizontal continuous casting in the same manner as in the above-mentioned Experimental Example 4-1 and a test piece was produced in accordance with Step A.

With respect to the obtained test piece of the copper alloy, there were examined tensile strength, electrical conductivity, adhesion of silver plating, life of a die, ability of primary rolling of the ingot, solderability of tin-lead plating after the heat resisting test and adhesion of the tin-lead plating after the heat resisting test (peeling of plating). The results were 830 N/mm$^2$, 39% IACS, good(○), not less than 12 tons/die, good, 200 hours and not less than 1,000 hours, respectively.

As mentioned above, the results of Experimental Example 5-2 were good, that is, the tensile strength was not less than 650 N/mm$^2$, the electrical conductivity was not less than 35% IACS, the life of a die was not less than 8 tons/die, the solderability was not less than 150 hours and adhesion was not less than 1,000 hours. Namely, the copper alloy of Experimental Example 5-2 has a good tensile strength and electrical conductivity and is excellent in adhesion of the silver plating and solderability and adhesion of solder after the heat resisting test, and in addition, the life of a graphite die in casting can be extended and the life of a die in stamping can be increased.

EXPERIMENTAL EXAMPLE 5-3

A copper alloy was made from 2.5% by weight of nickel, 0.62% by weight of silicon, 0.006% by weight of silver, 1.04% by weight of zinc, 0.005% by weight of lead and a residual of copper.

In Experimental Example 5-3, the relation of the silver content (Y % by weight) and the zinc content (X % by weight) meets the equation of $\log Y \geq 2.2X-5$.

In Experimental Example 5-3, a small ingot was produced in the same manner as in the above-mentioned Experimental Example 5-1 and a test piece was produced in accordance with Step A.

With respect to the obtained test piece of the copper alloy, there were examined tensile strength, electrical conductivity, adhesion of silver plating, solderability of tin-lead plating after the heat resisting test and adhesion of the tin-lead plating after the heat resisting test (peeling of plating). The results were 840 N/mm$^2$, 38% IACS, good(○), 200 hours and not less than 1,000 hours, respectively.

As mentioned above, the results of Experimental Example 5-3 were good, that is, the tensile strength was not less than 650 N/mm$^2$, the electrical conductivity was not less than 35% IACS, the solderability was not less than 150 hours and the adhesion was not less than 1,000 hours. Namely, the copper alloy of Experimental Example 5-3 has a good tensile strength and electrical conductivity and is excellent in adhesion of the silver plating and solderability and adhesion of solder after the heat resisting test, and in addition, the life of a die in stamping can be increased.

EXPERIMENTAL EXAMPLE 5-4

For comparison with the above-mentioned Experimental Examples 5-1 to 5-3, nearly the same amounts of nickel, silicon, silver, zinc and boron as in Experimental Examples 5-1 to 5-3 were added to copper and an amount of lead(Pb) was further increased. An ingot was produced through horizontal continuous casting in the same manner as in Experimental Example 4-1, and a test piece was made in accordance with Step A. Then the same characteristics as in the above-mentioned Experimental Examples were examined.

The results are shown in Table 7.

TABLE 7

| Experimental Example | Composition of alloy (% by weight) | | | | | | | | Whether the equation $\log Y \leq 2.2X - 5$ is met | Tensile strength (N/mm$^2$) | Electrical conductivity (% IACS) |
|---|---|---|---|---|---|---|---|---|---|---|---|
| | Cu | Ni | Si | Ag | Zn | Sn | B | Pb | | | |
| 5-1 | Residual | 2.5 | 0.61 | 0.011 | 1.02 | — | 0.0046 | 0.002 | ○ | 840 | 37 |
| 5-2 | Residual | 2.5 | 0.64 | 0.009 | 1.03 | — | 0.0054 | 0.009 | ○ | 830 | 39 |

TABLE 7-continued

| | | | | | | | | | | | |
|---|---|---|---|---|---|---|---|---|---|---|---|
| 5-3 | Residual | 2.5 | 0.62 | 0.006 | 1.04 | — | — | 0.005 | ○ | | 840 | 38 |
| 5-4 | Residual | 2.6 | 0.65 | 0.008 | 1.05 | — | 0.0065 | 0.035 | ○ | | — | — |

| Experimental Example | Adhesion of Ag plating | Life of die (ton/die) | Ability of primary rolling of ingot | Heat resisting test after Sn—Pb plating | | Production step |
|---|---|---|---|---|---|---|
| | | | | Solderability Ha (hour) | Adhesion Hb (hour) | |
| 5-1 | ○ | — | — | 200 | not less than 1,000 | A |
| 5-2 | ○ | not less than 12 | good | 200 | not less than 1,000 | A |
| 5-3 | ○ | — | — | 200 | not less than 1,000 | A |
| 5-4 | — | 2 | cracking occurred | — | — | — |

As is clear from Table 7, in Experimental Example 5-4 where lead was contained in an amount of more than 0.01% by weight, cracking occurred in the primary rolling of the ingot, but in Experimental Examples 5-1 to 5-3, no cracking occurred.

As is clear from the above-mentioned results, in EMBODIMENT 5 of the present invention, to copper which is a major component are added 1.7 to 4.0% by weight of nickel, 0.3 to 0.8% by weight of silicon, 2 to 0.3% by weight (preferably from 0.05 to 0.3% by weight) of silver, 0.5 to 2.0% by weight of zinc (Preferably the relation of the zinc content (X % by weight) and the silver content (Y % by weight) meets the equation of log Y≧2.2X−5) and 1 to 0.01% by weight of lead or 1.7 to 4.0% by weight of nickel, 0.3 to 0.8% by weight of silicon, 0.002 to 0.3% by weight (preferably from 0.05 to 0.3% by weight) of silver, 0.5 to 2.0% by weight of zinc (Preferably the relation of the zinc content (X % by weight) and the silver content (Y % by weight) meets the equation of log Y≧2.2X−5), 0.0005 to 0.01% by weight of boron and 0.0001 to 0.01% by weight of lead. Therefore as explained in EMBODIMENTS 1 and 2, there are obtained effects that the tensile strength and electrical conductivity are maintained, that the adhesion of silver plating and solderability and adhesion of solder after the heat resisting test are excellent, that the life of a die in stamping can be extended and that the life of the graphite die can be increased when boron is contained.

EMBODIMENT 6

EMBODIMENT 6 of the present invention relates to the copper alloy for electronic parts which consists essentially of copper as a major component, 1.7 to 4.0% by weight of nickel(Ni), 0.3 to 0.8% by weight of silicon(Si), 0.0002 to 0.3% by weight (preferably from 0.05 to 0.3% by weight) of silver(Ag), 0.5 to 2.0% by weight of zinc(Zn) (Preferably the relation of the zinc content (X % by weight) and the silver content (Y % by weight) meets the equation of log Y≧2.2X−5), 0.1 to 0.4% by weight of tin(Sn) and 1 to 0.01% by weight of lead(Pb) or the copper alloy for electronic parts which consists essentially of copper as a major component, 1.7 to 4.0% by weight of nickel(Ni), 0.3 to 0.8% by weight of silicon(Si), 2 to 0.3% by weight (preferably from 0.05 to 0.3% by weight) of silver(Ag), 0.5 to 2.0% by weight of zinc(Zn) (Preferably the relation of the zinc content (X % by weight) and the silver content (Y % by weight) meets the equation of log Y≧2.2X−5), 0.0005 to 0.01% by weight of boron(B), 0.1 to 0.4% by weight of tin(Sn) and 1 to 0.01% by weight of lead(Pb).

Explained below are Experimental Examples of EMBODIMENT 6. Compositions and characteristics of alloys of each Experimental Example are shown in Table 8.

EXPERIMENTAL EXAMPLE 6-1

A copper alloy was made from 2.6% by weight of nickel, 0.61% by weight of silicon, 0.010% by weight of silver, 1.03% by weight of zinc, 0.0056% by weight of boron, 0.20% by weight of tin, 0.003% by weight of lead and a residual of copper.

In Experimental Example 6-1, the relation of the silver content (Y % by weight) and the zinc content (X % by weight) meets the equation of log Y≧2.2X−5.

In Experimental Example 6-1, a small ingot was produced in the same manner as in the above-mentioned Experimental Example 1-1, and a test piece was produced in accordance with Step A.

With respect to the obtained test piece of the copper alloy, there were examined tensile strength, electrical conductivity, adhesion of silver plating, solderability of tin-lead plating after the heat resisting test and adhesion of the tin-lead plating after the heat resisting test (peeling of plating). The results were 850 N/mm², 38% IACS, good(○), 200 hours and not less than 1,000 hours, respectively.

As mentioned above, the results of Experimental Example 6-1 were good, that is, the tensile strength was not less than 650 N/mm², the electrical conductivity was not less than 35% IACS, the solderability was not less than 150 hours and the adhesion was not less than 1,000 hours. Namely, the copper alloy of Experimental Example 6-1 has a good tensile strength and electrical conductivity and is excellent in adhesion of the silver plating and solderability and adhesion of solder after the heat resisting test, and in addition, the life of a die in stamping can be increased.

Also scraps of the tin-plated article can be recycled depending on application of the copper alloy.

EXPERIMENTAL EXAMPLE 6-2

A copper alloy was made from 2.5% by weight of nickel, 0.63% by weight of silicon, 0.009% by weight of silver, 1.01% by weight of zinc, 0.00051% by weight of boron, 0.19% by weight of tin, 0.007% by weight of lead and a residual of copper.

In Experimental Example 6-2, the relation of the silver content (Y % by weight) and the zinc content (X % by weight) meets the equation of log Y≧2.2X−5.

In Experimental Example 6-2, an ingot was produced through horizontal continuous casting in the same manner as in the above-mentioned Experimental Example 4-1, and a test piece was produced in accordance with Step A.

With respect to the obtained test piece of the copper alloy, there were examined tensile strength, electrical conductivity, adhesion of silver plating, life of a die, ability of primary rolling of the ingot, solderability of tin-lead plating after the heat resisting test and adhesion of the tin-lead plating after the heat resisting test (peeling of plating). The results were 840 N/mm², 39% IACS, good(○), not less than 12 tons/die, good, 200 hours and not less than 1,000 hours, respectively.

As mentioned above, the results of Experimental Example 6-2 were good, that is, the tensile strength was not less than 650 N/mm², the electrical conductivity was not less than 35% IACS, the life of the die was not less than 8 tons/die, the solderability was not less than 150 hours and the adhesion was not less than 1,000 hours. Namely, the copper alloy of Experimental Example 6-2 has a good tensile strength and electrical conductivity and is excellent in adhesion of the silver plating and solderability and adhesion of solder after the heat resisting test, and in addition, the life of the die in horizontal continuous casting and the life of the die in stamping can be increased.

Also scraps of the tin-plated article can be recycled depending on application of the copper alloy.

EXPERIMENTAL EXAMPLE 6-3

A copper alloy was made from 2.5% by weight of nickel, 0.60% by weight of silicon, 0.007% by weight of silver, 1.02% by weight of zinc, 0.19% by weight of tin, 0.006% by weight of lead and a residual of copper.

In Experimental Example 6-3, the relation of the silver content (Y % by weight) and the zinc content (X % by weight) meets the equation of log Y≧2.2X−5.

In Experimental Example 6-3, a small ingot was produced in the same manner as in the above-mentioned Experimental Example 6-1, and a test piece was produced in accordance with Step A.

With respect to the obtained test piece of the copper alloy, there were examined tensile strength, electrical conductivity, adhesion of silver plating, solderability of tin-lead plating after the heat resisting test and adhesion of the tin-lead plating after the heat resisting test (peeling of plating). The results were 850 N/mm², 38% IACS, good(○), 200 hours and not less than 1,000 hours, respectively.

As mentioned above, the results of Experimental Example 6-3 were good, that is, the tensile strength was not less than 650 N/mm², the electrical conductivity was not less than 35% IACS, the solderability was not less than 150 hours and the adhesion was not less than 1,000 hours. Namely, the copper alloy of Experimental Example 6-3 has a good tensile strength and electrical conductivity and is excellent in adhesion of the silver plating and solderability and adhesion of solder after the heat resisting test, and in addition, the life of a die in stamping can be increased.

Also scraps of the tin-plated article can be recycled depending on application of the copper alloy.

TABLE 8

| Experimental Example | Composition of alloy (% by weight) | | | | | | | | Whether the equation log Y ≧ 2.2X − 5 is met | Tensile strength (N/mm²) | Electrical conductivity (% IACS) |
|---|---|---|---|---|---|---|---|---|---|---|---|
| | Cu | Ni | Si | Ag | Zn | Sn | B | Pb | | | |
| 6-1 | Residual | 2.6 | 0.61 | 0.010 | 1.03 | 0.20 | 0.0056 | 0.003 | ○ | 850 | 38 |
| 6-2 | Residual | 2.5 | 0.63 | 0.009 | 1.01 | 0.19 | 0.0051 | 0.007 | ○ | 840 | 39 |
| 6-3 | Residual | 2.5 | 0.60 | 0.007 | 1.02 | 0.19 | — | 0.006 | ○ | 850 | 38 |

| Experimental Example | Adhesion of Ag plating | Life of die (ton/die) | Ability of primary rolling of ingot | Heat resisting test after Sn—Pb plating | | Production step |
|---|---|---|---|---|---|---|
| | | | | Solderability Ha (hour) | Adhesion Hb (hour) | |
| 6-1 | ○ | — | — | 200 | not less than 1,000 | A |
| 6-2 | ○ | not less than 12 | good | 200 | not less than 1,000 | A |
| 6-3 | ○ | — | — | 200 | not less than 1,000 | A |

As is clear from the above-mentioned results, in EMBODIMENT 6 of the present invention, to copper which is a major component are added 1.7 to 4.0% by weight of nickel(Ni), 0.3 to 0.8% by weight of silicon(Si), 0.002 to 0.3% by weight (preferably from 0.05 to 0.3% by weight) of silver(Ag), 0.5 to 2.0% by weight of zinc(Zn) (Preferably the relation of the zinc content (X % by weight) and the silver content (Y % by weight) meets the equation of log Y≧2.2X−5), 0.1 to 0.4% by weight of tin(Sn) and 0.001 to 0.01% by weight of lead(Pb) or 1.7 to 4.0% by weight of nickel(Ni), 0.3 to 0.8% by weight of silicon(Si), 0.002 to 0.3% by weight (preferably from 0.05 to 0.3% by weight) of silver (Ag), 0.5 to 2.0% by weight of zinc(Zn) (Preferably the relation of the zinc content (X % by weight) and the silver content (Y % by weight) meets the equation of log Y≧2.2X−5), 0.0005 to 0.01% by weight of boron(B), 0.1 to 0.4% by weight of tin(Sn) and 0.001 to 0.01% by weight of lead(Pb). Therefore as explained in EMBODIMENTS 1 and 2, there are obtained effects that the tensile strength and electrical conductivity are maintained, that the adhesion of silver plating and solderability and adhesion of solder after the heat resisting test are excellent, that the life of a die in stamping can be increased and that the life of a graphite die can be extended when boron is contained.

EMBODIMENT 7 (IC lead-frame)

FIG. 1 is a plan view of the IC lead-frame of EMBODIMENT 7 of the present invention, which is an example of an IC lead-frame A produced by etching by using the copper alloy for electronic parts of the above-mentioned EMBODIMENTS 1 to 6. In FIG. 1, numeral 3 represents a die pad on which a semiconductor chip is provided, and numeral 6 represents a lead part.

EMBODIMENT 8 (Semiconductor device)

Figure 2:
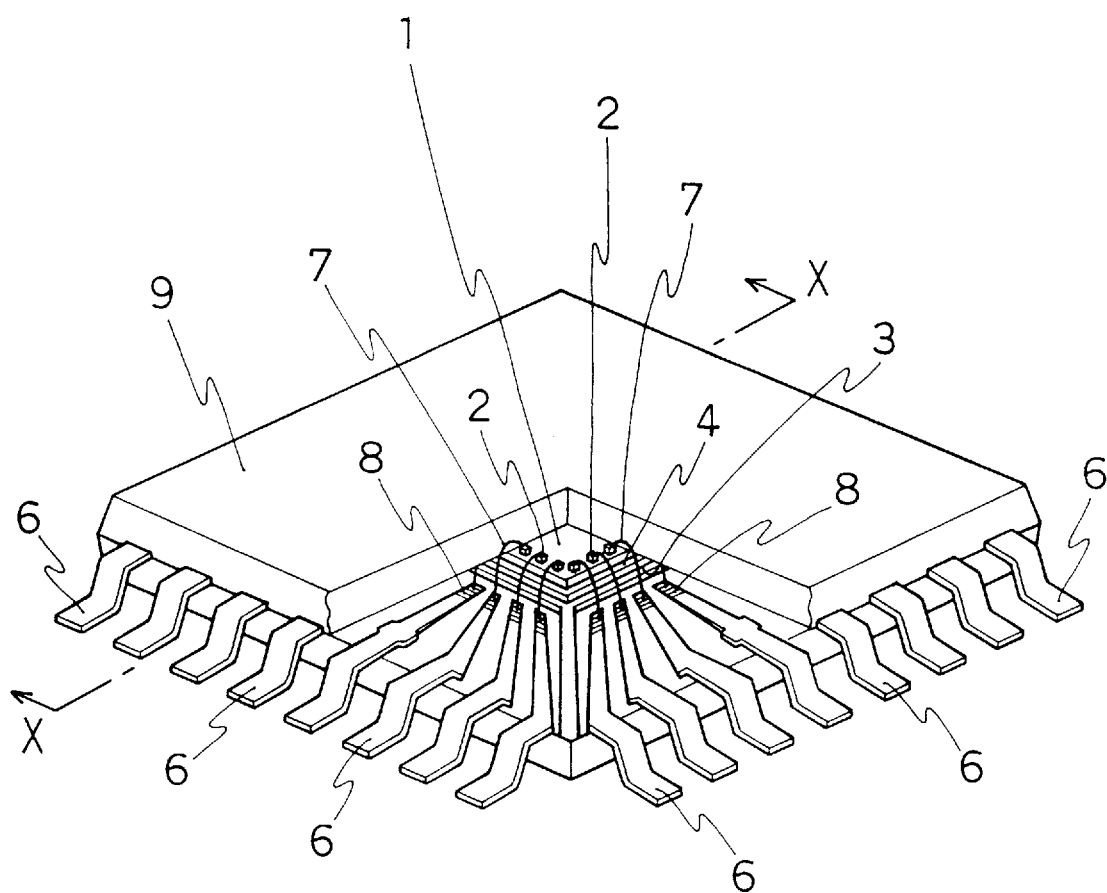
FIG. 2 is a partly cutout perspective view of the semiconductor device of EMBODIMENT 8 of the present invention.

FIG. 2 shows a semiconductor device of EMBODIMENT 8 of the present invention. FIG. 2 is a partly cutout perspective view of the semiconductor device, in which a lead-frame is made of a copper alloy for electronic parts of the above-mentioned EMBODIMENTS 1 to 6, and FIG. 3 is a sectional view of a line X—X of FIG. 2.

Figure 3:
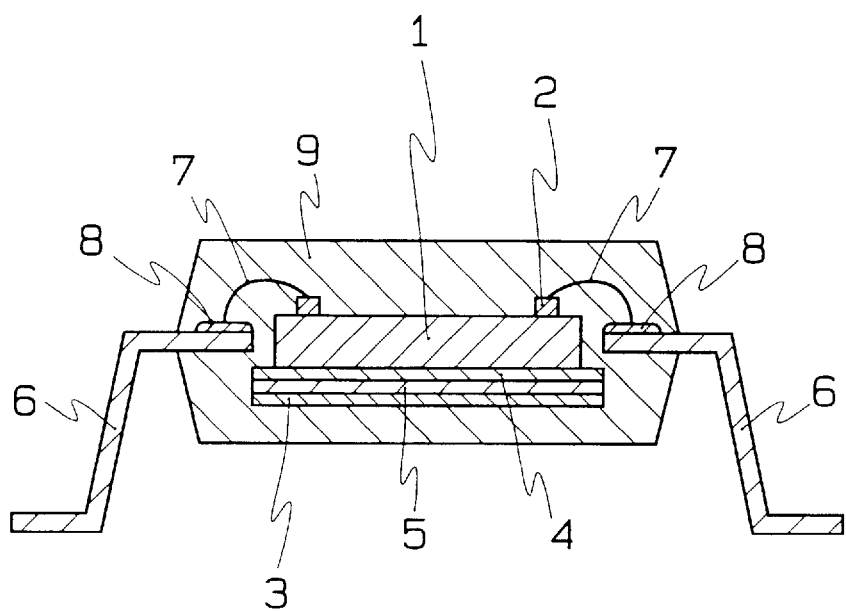
FIG. 3 is a sectional view of a line X—X of FIG. 2.

In FIGS. 2 and 3, numeral 1 represents a semiconductor chip having a plurality of bonding pads 2, and numeral 3 represents a die pad. On the die pad is provided the semiconductor chip. The die pad is made of the copper alloy of any of the above-mentioned EMBODIMENTS 1 to 6, is plated with silver 5 on its surface and is jointed to a back surface of the semiconductor chip through a joint 4 of plating (Pb—Sn) or a resin. Numeral 6 is a lead part provided for each of plural bonding pads 2 of the semiconductor chip and is electrically connected to the corresponding bonding pad by a wire 7. The lead part is made of the copper alloy of any of the above-mentioned EMBODIMENTS 1 to 6. The above-mentioned die pad 3 and the lead part 6 form the lead-frame.

An end 8 of the lead part 6 (top end of inner lead portion) is spot-plated with silver. To the silver-plated part 8 usually is electrically connected the wire 7 by thermocompression bonding. An outer lead portion of the lead part is plated with tin-lead (Sn—Pb) after packaging with a resin.

Numeral 9 is a resin which packages the semiconductor chip 1, the die pad 3 and the lead parts 6 except the outer lead portion.

Since in the above-mentioned semiconductor device, the die pad 3 and the lead parts 6 are made of the copper alloy for electronic parts of EMBODIMENTS 1 to 6, the following effects are exhibited.

The first effect is such that since the copper alloys of EMBODIMENTS 1 to 6 have a high tensile strength, the lead part 6 maintains at high strength and is very resistant to deformation.

The second effect is such that since the copper alloys of EMBODIMENTS 1 to 6 have a high electrical conductivity, a resistance loss on the lead part 6 is small and the thermal conductivity correlative to electrical conductivity becomes high, and thus the high heat radiation from the die pad 3 can be obtained, corresponding to heat being generated in the semiconductor chip 1.

The third effect is such that since the copper alloys of EMBODIMENTS 1 to 6 are excellent in adhesion of silver plating, the reliability of electrical connection of the top end of the lead part 6 (silver-plated part 8) and the wire 7 is high.

The fourth effect is such that since the copper alloys of EMBODIMENTS 1 to 6 are excellent in solderability and adhesion of solder after the heat resisting test, the reliability of mounting of the semiconductor chip 1, for example, reliability of electrical connection and the like when soldering the outer lead portion of the lead part 6 to a circuit board, etc. is high.

EMBODIMENT 9 (Connector)

Figure 4:
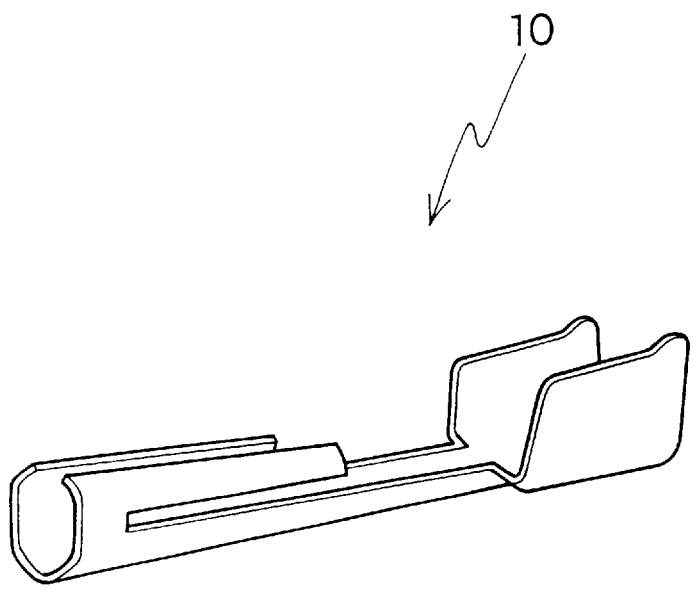
FIG. 4 is a perspective view of the connector pin of EMBODIMENT 9 of the present invention.

FIG. 4 is a perspective view of a connector pin 10 which is one example of the connector of EMBODIMENT 9 of the present invention and is produced by stamping by using the copper alloy for electronic parts of the above-mentioned EMBODIMENTS 1 to 6. The connector of the present invention is excellent in not only strength and electrical conductivity but also formability in bending and processability of dimples.

What is claimed is:

1. A copper alloy for electronic parts, which consists essentially of 1.7 to 4.0% by weight of nickel, 0.3 to 0.8% by weight of silicon, 0.002 to 0.3% by weight of silver, 0.5 to 2.0% by weight of zinc and a balance of coppers wherein said copper alloy has a solderability Ha of at least 150 hours, and an adhesion Hb of not less than 1,000 hours.

2. The copper alloy for electronic parts of claim 1, wherein the relation of a silver content Y % by weight and a zinc content X % by weight is represented by the equation: $\log Y \geq 2.2X-5$.

3. The copper alloy for electronic parts of claim 1, which further consists essentially of 0.0005 to 0.01% by weight of boron.

4. The copper alloy for electronic parts of claim 2, which further consists essentially of 0.0005 to 0.01% by weight of boron.

5. The copper alloy for electronic parts of claim 1, which further consists essentially of 0.1 to 0.4% by weight of tin.

6. The copper alloy for electronic parts of claim 2, which further consists essentially of 0.1 to 0.4% by weight of tin.

7. The copper alloy for electronic parts of claim 3, which further consists essentially of 0.1 to 0.4% by weight of tin.

8. The copper alloy for electronic parts of claim 4, which further consists essentially of 0.1 to 0.4% by weight of tin.

9. The copper alloy for electronic parts of claim 1, which further consists essentially of 0.001 to 0.01% by weight of lead.

10. The copper alloy for electronic parts of claim 3, which further consists essentially of 0.001 to 0.01% by weight of lead.

11. The copper alloy for electronic parts of claim 5, which further consists essentially of 0.001 to 0.01% by weight of lead.

12. The copper alloy for electronic parts of claim 7, which further consists essentially of 0.001 to 0.01% by weight of lead.

13. A lead-frame for integrated circuits which is made of a copper alloy for electronic parts which consists essentially of 1.7 to 4.0% by weight of nickel, 0.3 to 0.8% by weight of silicon, 0.0002 to 0.3% by weight of silver, 0.5 to 2.0% by weight of zinc and a balance of copper, wherein said copper alloy has a solderability Ha of at least 150 hours, and an adhesion Hb of not less than 1,000 hours.

14. The lead-frame for integrated circuits of claim 13, wherein the copper alloy for electronic parts further consists essentially of 0.0005 to 0.01% by weight of boron.

15. The lead-frame for integrated circuits of claim 13, wherein the copper alloy for electronic parts further consists essentially of 0.1 to 0.4% by weight of tin.

16. The lead-frame for integrated circuits of claim 13, wherein the copper alloy for electronic parts further consists essentially of 0.0005 to 0.01% by weight of boron and 0.1 to 0.4% by weight of tin.

17. A connector which is made of a copper alloy for electronic parts which consists essentially of 1.7 to 4.0% by weight of nickel, 0.3 to 0.8% by weight of silicon, 0.002 to 0.3% by weight of silver, 0.5 to 2.0% by weight of zinc and a balance of copper, wherein said copper alloy has a solderability Ha of at least 150 hours, and an adhesion Hb of not less than 1,000 hours.

18. The connector of claim 17, wherein the copper alloy for electronic parts further consists essentially of 0.0005 to 0.01% by weight of boron.

19. The connector of claim 17, wherein the copper alloy for electronic parts further consists essentially of 0.1 to 0.4% by weight of tin.

20. The connector of claim 17, wherein the copper alloy for electronic parts further contains 0.0005 to 0.01% by weight of boron and 0.1 to 0.4% by weight of tin.

* * * * *